US012584237B2

(12) United States Patent
Park et al.

(10) Patent No.: US 12,584,237 B2
(45) Date of Patent: Mar. 24, 2026

(54) APPARATUS FOR CONTINUOUSLY GROWING INGOT

(71) Applicants: HANWHA SOLUTIONS CORPORATION, Seoul (KR); HANWHA CORPORATION, Seoul (KR)

(72) Inventors: Jin Sung Park, Seoul (KR); Kyung Seok Lee, Seoul (KR); Young Jun Lee, Seoul (KR); Keun Ho Kim, Seoul (KR); Han Woong Jeon, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 207 days.

(21) Appl. No.: 18/246,520

(22) PCT Filed: Sep. 3, 2021

(86) PCT No.: PCT/KR2021/011932
    § 371 (c)(1),
    (2) Date: Mar. 24, 2023

(87) PCT Pub. No.: WO2022/065737
    PCT Pub. Date: Mar. 31, 2022

(65) Prior Publication Data
    US 2023/0366122 A1      Nov. 16, 2023

(30) Foreign Application Priority Data

Sep. 24, 2020    (KR) ........................ 10-2020-0123637

(51) Int. Cl.
    C30B 15/12        (2006.01)
    C30B 15/00        (2006.01)
    C30B 29/06        (2006.01)

(52) U.S. Cl.
    CPC ............ C30B 15/12 (2013.01); C30B 15/002 (2013.01); C30B 29/06 (2013.01)

(58) Field of Classification Search
    CPC ....... C30B 15/002; C30B 15/02; C30B 15/10; C30B 15/12; C30B 29/06
    See application file for complete search history.

(56) References Cited

U.S. PATENT DOCUMENTS 4,282,184 A      8/1981   Fiegl
5,494,265 A  *   2/1996   Ventre ..................... F27D 11/02
                                                                266/275
(Continued)

FOREIGN PATENT DOCUMENTS

CN          103205802 A      7/2013
CN          215366054 U     12/2021
(Continued)

OTHER PUBLICATIONS

CN Office Action dated Dec. 23, 2024.
Office Action From Indian Patent Office Dated Nov. 4, 2025, Issued for Indian Patent Application No. 202317028729.

*Primary Examiner* — Hua Qi
(74) *Attorney, Agent, or Firm* — Harvest IP Law, LLP

(57)              ABSTRACT

The present invention relates to a continuous ingot growing apparatus, and more specifically, to a continuous ingot growing apparatus which melts a solid silicon material supplied to a preliminary crucible to supply the solid silicon material to a main crucible and which can adjust a supply amount of molten silicon while blocking floating matter floating on top of the molten silicon so as not to be supplied.

8 Claims, 10 Drawing Sheets

(56)          References Cited

U.S. PATENT DOCUMENTS

| | | | | | |
|---|---|---|---|---|---|
| 6,423,137 | B1 * | 7/2002 | Takase | .................... | C30B 15/02 |
| | | | | | 117/34 |
| 2005/0092236 | A1 * | 5/2005 | Bender | .................. | C30B 15/22 |
| | | | | | 117/200 |
| 2011/0158887 | A1 * | 6/2011 | Stoddard | ................. | C30B 29/06 |
| | | | | | 432/2 |
| 2011/0174214 | A1 * | 7/2011 | Horioka | ................. | C30B 15/02 |
| | | | | | 117/223 |
| 2018/0066377 | A1 * | 3/2018 | Hayashi | ................. | C30B 15/04 |

FOREIGN PATENT DOCUMENTS

| | | | | |
|---|---|---|---|---|
| JP | 09255470 | A | * | 9/1997 |
| JP | H09255470 | A | * | 9/1997 |
| JP | 11-092276 | A | | 4/1999 |
| JP | 2003201197 | A | * | 7/2003 |
| JP | 2018-039690 | A | | 3/2018 |
| KR | 20160098869 | A | | 8/2016 |
| KR | 10-2217883 | B1 | | 2/2021 |

* cited by examiner 211 (211a,211b,211c)

211b
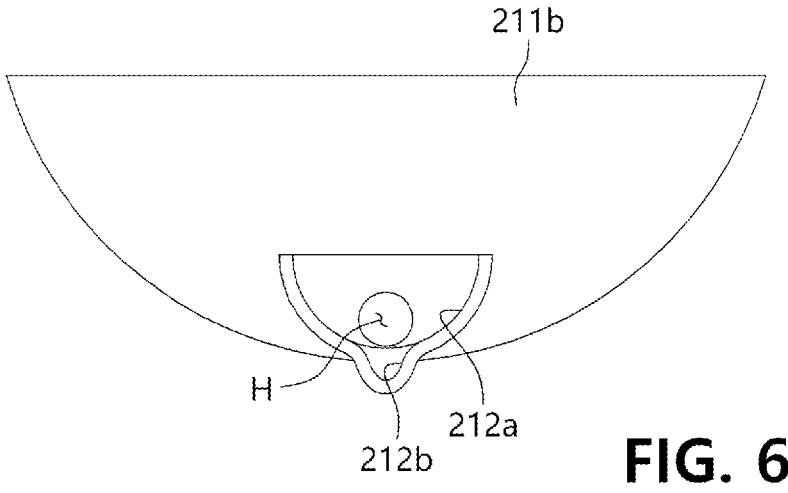
H     212a
212b
FIG. 6
211b
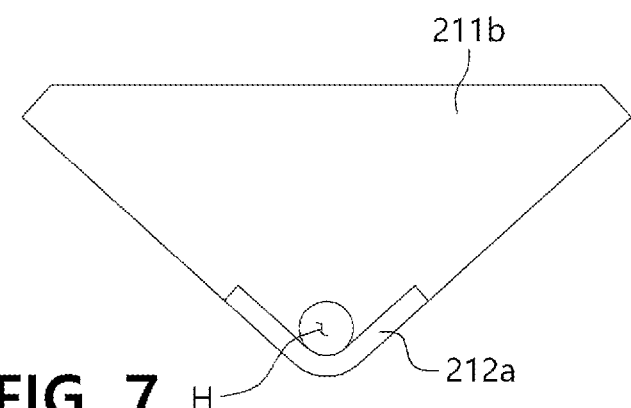
FIG. 7   H    212a
211b
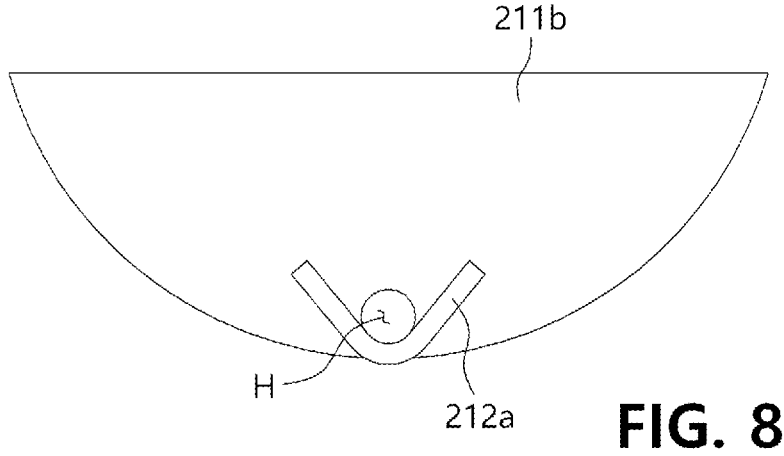
H    212a
FIG. 8

211 (211a, 211b, 211c)
212 (212a, 212b, 212c)
212a (212a-1, 212a-2)

211 (211a,211b,211c)
212 (212a,212b)

211 (211a,211b,211c)
212 (212a,212b)

211 (211a,211b,211c)
212 (212a,212b)

APPARATUS FOR CONTINUOUSLY GROWING INGOT

CROSS-REFERENCE TO RELATED APPLICATION(S)

This application is a National Stage of International Application No. PCT/KR2021/011932 filed Sep. 3, 2021, claiming priority based on Korean Patent Application No. 10-2020-0123637 filed Sep. 24, 2020, the disclosure of which is incorporated herein by reference in its entirety.

FIELD OF THE INVENTION

The present invention relates to a continuous ingot growing apparatus, and more specifically, to a continuous ingot growing apparatus which melts a solid silicon material supplied to a preliminary crucible to supply the solid silicon material to a main crucible and which can adjust a supply amount of molten silicon while blocking floating matter floating on top of the molten silicon so as not to be supplied.

DISCUSSION OF RELATED ART

Generally, the Czochralski crystal growth methods are mainly used as methods of manufacturing ingots to manufacture single-crystal silicon wafers for semiconductors.

In the Czochralski crystal growth methods, silicon is put into a crucible, and is melted by heating the crucible. Then, when a single-crystal seed is lifted upward simultaneously with rotation in a state of being in contact with the molten silicon, an ingot having a predetermined diameter grows. Among the Czochralski crystal growth methods, a method in which an ingot continuously grows while supplementing molten silicon as much as it is consumed by continuously introducing a solid silicon material (polysilicon) into a crucible is a continuous growth type Czochralski (CCz) method.

In the conventional continuous growth type Czochralski crystal growth method, a dual-type crucible has been used to directly melt a solid silicon material in the crucible, but the dual-type crucible has a problem that causes an increase in manufacturing cost of an ingot molding apparatus.

Further, a silicon has been supplied by directly introducing a solid silicon material into a crucible in a fixed amount, but when the solid silicon material is supplied in this way, there is a problem in that molten silicon splashes in a main crucible.

Meanwhile, attempts have been made to solve the problem of the splashing of molten silicon by lowering a height at which a liquid silicon material is introduced, but there is a problem in that as a portion into which the liquid silicon material is introduced is disposed adjacent to the main crucible, thermal deformation occurs, which makes it difficult to use for a long time.

SUMMARY OF THE INVENTION

The present invention is directed to providing a continuous ingot growing apparatus which melts a solid silicon material supplied to a preliminary crucible to supply the solid silicon material to a main crucible and which can adjust a supply amount of molten silicon while blocking floating matter floating on top of the molten silicon so as not to be supplied.

According to an aspect of the present invention, there is provided a continuous ingot growing apparatus including a growth furnace in which a main crucible is positioned in which molten silicon is accommodated to form an ingot, a material supply unit configured to supply a solid silicon material before the molten silicon is melted, and a preliminary melting unit including a preliminary crucible that melts the solid silicon material supplied from the material supply unit and supplies the molten silicon to the main crucible, and a preliminary crucible heating module that heats the preliminary crucible, wherein the preliminary crucible includes a body in which the solid silicon material is accommodated, and a beak which is provided on one side of the body so that the molten silicon melted in the body is supplied to the main crucible, and in which the molten silicon moves, and an opening is formed in the body so that the molten silicon moves to the beak.

The body may include a body plate in a form of a container opened upward in a height direction to accommodate the solid silicon material, a first partition provided on one side of the body plate and in which the opening is formed, and a second partition provided on another side of the body plate.

The opening may be formed at a lowermost end of the first partition in the height direction.

The preliminary crucible is movable between a first position at which the solid silicon material is accommodated and a second position at which the molten silicon is supplied to the main crucible, and the preliminary crucible may move from the first position to the second position when a height of the molten silicon is higher than or equal to a height of an uppermost end of the opening.

The beak may include a moving surface in a form of a container opened upward in the height direction to accommodate the molten silicon supplied to the main crucible, and an inclined surface that is formed on one side of the moving surface and formed with a downward slope in the height direction so as to be adjacent to the main crucible.

The moving surface may be formed such that an interval between inner surfaces thereof disposed to face each other is constantly reduced.

The body plate may be formed such that an interval between inner surfaces thereof disposed to face each other is constantly reduced.

The molten silicon accommodated in the main crucible may rotate in one direction, and the beak may be disposed such that the molten silicon is supplied in a direction tangential to a rotational direction of the molten silicon.

The beak may have a curved surface on which a moving direction of the molten silicon is changed so that the molten silicon moves first in a first supply direction toward a center of the main crucible and then moves in a second supply direction, which is a direction tangential to a rotational direction of the main crucible.

A thickness of the second partition may be greater than a thickness of the beak.

A thickness of the body plate and a thickness of the first partition may be greater than the thickness of the beak, and a slope may be formed in the opening so that the molten silicon moves downward from the body plate to the beak.

According to another aspect of the present invention, there is provided a continuous ingot growing apparatus including a growth furnace in which a main crucible is positioned in which molten silicon is accommodated to form an ingot, a material supply unit configured to supply a solid silicon material before the molten silicon is melted, and a preliminary melting unit including a preliminary crucible that melts the solid silicon material supplied from the material supply unit and supplies the molten silicon to the main crucible, and a preliminary crucible heating module that heats the preliminary crucible, wherein the preliminary crucible includes a body in which the solid silicon material is accommodated, and a beak which is provided on one side of the body so that the molten silicon melted in the body is supplied to the main crucible, and in which the molten silicon moves, the body includes a body plate in a form of a container opened upward in a height direction to accommodate the solid silicon material, and the body plate is formed in a form in which an interval between inner surfaces thereof disposed to face each other is gradually reduced.

The body plate may be formed such that the interval between the inner surfaces disposed to face each other is smoothly reduced.

The body plate may be formed such that the interval between the inner surfaces disposed to face each other is constantly reduced.

An opening may be formed in the body so that the molten silicon moves to the beak, and the body may include a first partition provided on one side of the body plate and in which the opening is formed, and a second partition provided on another side of the body plate.

The beak may include a moving surface in a form of a container opened upward in a height direction to accommodate the molten silicon supplied to the main crucible.

The moving surface may be formed such that the interval between the inner surfaces disposed to face each other is gradually reduced.

The moving surface may be formed such that the interval between the inner surfaces disposed to face each other is constantly reduced.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 4 is a set of cross-sectional views illustrating a preliminary melting unit according to an embodiment of the present invention, wherein FIG. 4(a) is a view illustrating a state in which a preliminary crucible is positioned at a first position, and FIG. 4(b) is a view illustrating a state in which a preliminary crucible is positioned at a second position;

FIG. 6 is a front view illustrating a preliminary crucible according to an embodiment of the present invention;

FIG. 7 is a front view illustrating a preliminary crucible according to another embodiment of the present invention;

FIG. 8 is a front view illustrating a preliminary crucible according to still another embodiment of the present invention;

DETAILED DESCRIPTION OF EXEMPLARY EMBODIMENTS

Terms and words used in this specification and claims should not be interpreted as being limited to commonly used meanings or meanings in dictionaries and should be interpreted with meanings and concepts which are consistent with the technological scope of the invention based on the principle that the inventors have appropriately defined concepts of terms in order to describe the invention in the best way.

Therefore, since the embodiments described in this specification and configurations illustrated in drawings are only exemplary embodiments and do not represent the overall technological scope of the invention, it is understood that the invention covers various equivalents, modifications, and substitutions at the time of filing of this application.

It should be further understood that the terms "comprise," "comprising," "include," and/or "including," when used herein, specify the presence of stated features, integers, steps, operations, elements, parts, or combinations thereof, but do not preclude the presence or addition of one or more other features, integers, steps, operations, elements, parts, or combinations thereof.

When an element is referred to as being disposed in the "front," "rear," "above," or "below" of another element, it includes a case in which "an element is disposed in the "front," "rear," "above," or "below" of another element to be direct contact therewith and a case in which third element is disposed between the two elements, unless otherwise stated. Further, when an element is referred to as being "connected" to another element, it includes a case in which an element is directly connected to another element and a case in which an element is indirectly connected to another element, unless otherwise stated.

Figure 1:
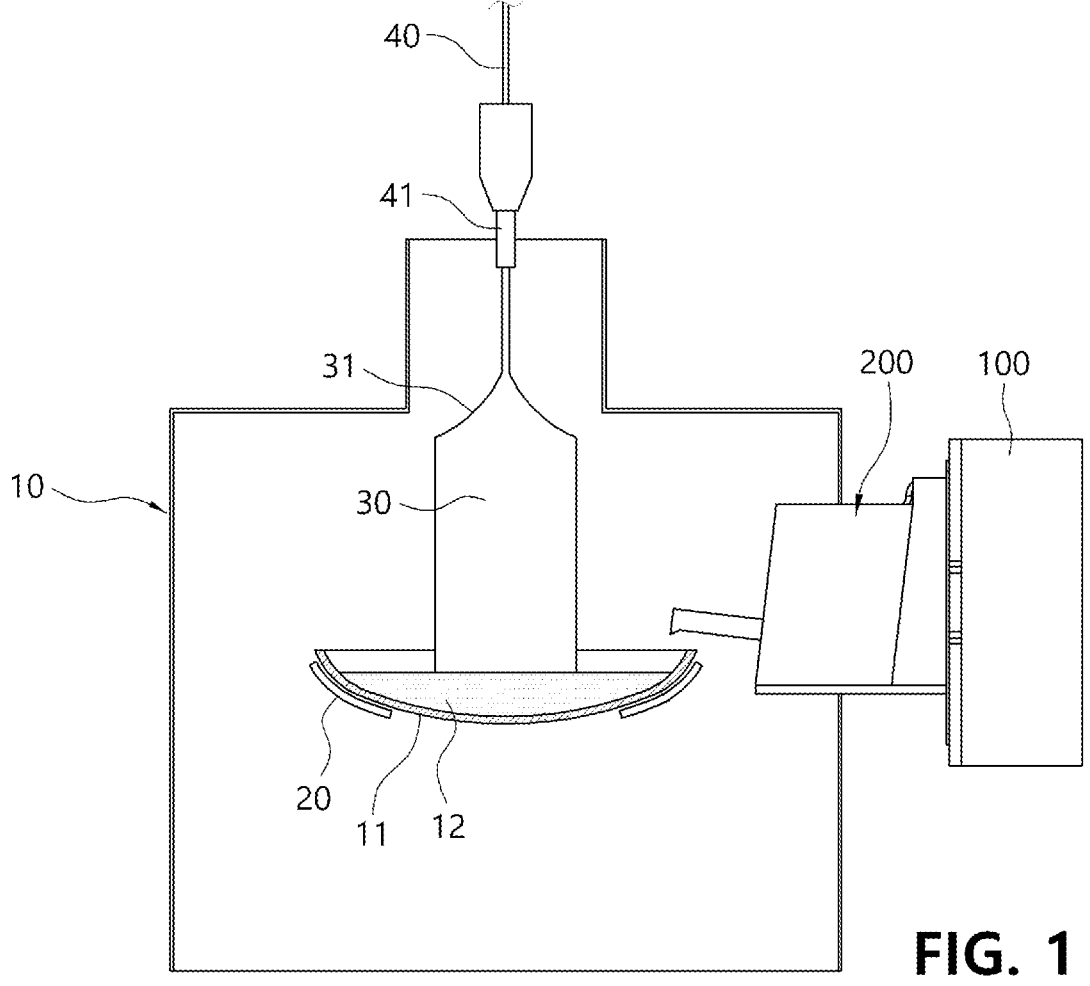
FIG. 1 is a cross-sectional view illustrating a continuous ingot growing apparatus according to an embodiment of the present invention.
Figure 2:
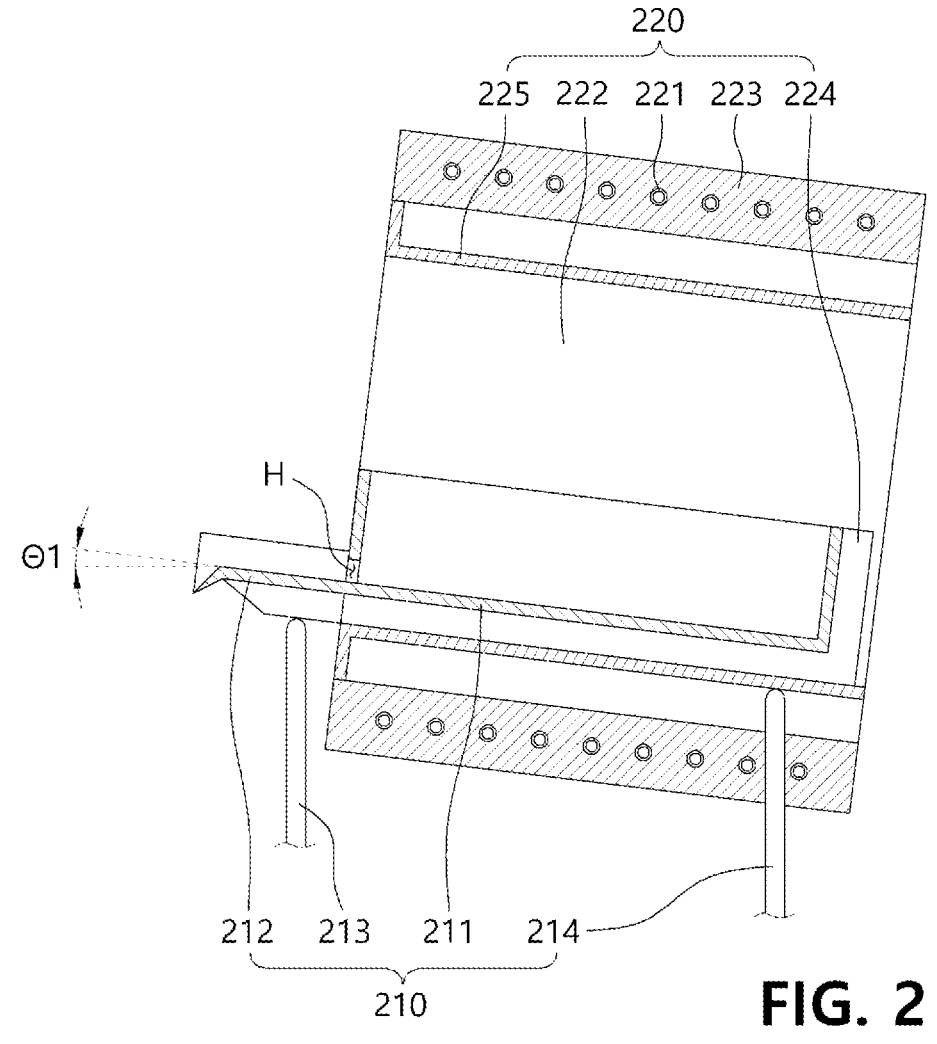
FIG. 2 is a cross-sectional view illustrating a preliminary melting unit according to an embodiment of the present invention.

Hereinafter, a continuous ingot growing apparatus according to the present invention will be described with reference to the accompanying drawings. FIG. 1 is a cross-sectional view illustrating a continuous ingot growing apparatus according to an embodiment of the present invention, and FIG. 2 is a cross-sectional view illustrating a preliminary melting unit according to the embodiment of the present invention. In this specification, in describing the ingot growing apparatus according to the embodiment of the present invention, configurations irrelevant to the content of the present invention are not illustrated in detail or are omitted for the sake of simplifying the drawings, and the ingot growing apparatus according to the present invention will be described with a focus on the content related to the spirit of the present invention.

As illustrated in FIG. 1, the continuous ingot growing apparatus according to the embodiment of the present invention may include a growth furnace 10 in which a main crucible 11 is positioned in which molten silicon 12 is accommodated to form an ingot 30.

A bottom heater 20 for maintaining an appropriate temperature of the molten silicon 12 accommodated in the main crucible 11 may be provided, the bottom heater may be formed to adjust a concentration of oxygen by providing a separate magnetic field so that circulating convection occurs in the molten silicon 12, and the temperature and magnetic field of the bottom heater 20 are constantly maintained according to temperature and magnetic field profiles determined during the growth of the ingot 30.

In such a state, a separate lifting device (not illustrated) rotates and is lifted in a state in which a lifting wire 40 is lowered so that a seed 41 at a lower end of the lifting wire 40 comes into contact with the molten silicon 12.

In this case, rotational and lifting speeds of the lifting wire 40 are uniformly maintained according to rotational and lifting speed profiles predetermined throughout the entire process.

When the lifting wire 40 moves upward, an upper portion of the ingot 30 inclined downward from the seed 41 is crystallized, the upper portion of the ingot 30, which is commonly referred to as a shoulder portion 31, is formed while the upward movement continues, and then a height of the crystallized ingot 30 is gradually increased and the ingot 30 grows.

A material supply unit 100 that supplies a solid silicon material before the molten silicon 12 is melted may be provided, and the material supply unit 100 measures an amount of the solid silicon material and supplies the solid silicon material in a fixed amount.

The material supply unit 100 may include a storage unit (not illustrated) in which the solid silicon material is stored, a transfer module (not illustrated) for transferring the solid silicon material from the storage unit, and a bucket (not illustrated) in the form of a container opened upward to accommodate the solid silicon material transferred from the transfer module, wherein the bucket (not illustrated) may be formed to rotate around a horizontal shaft inside a preliminary melting unit 200.

Further, the material supply unit 100 may be spatially connected to one side of the preliminary melting unit 200, and a separate bucket transfer module (not illustrated) may be provided in the material supply unit 100 so that the bucket can move between the material supply unit 100 and the preliminary melting unit 200.

In addition, a blocking plate (not illustrated) which can be opened or closed may be provided between the material supply unit 100 and the preliminary melting unit 200 in order to prevent heat loss.

The preliminary melting unit 200 described above may include a preliminary crucible 210 that melts the solid silicon material supplied from the material supply unit 100 and supplies the molten silicon 12 to the main crucible 11, and a preliminary crucible heating module 220 that heats the preliminary crucible 210.

The preliminary crucible 210 includes a body 211 in which the solid silicon material is accommodated, and a beak 212 provided on one side of the body 211 so that the molten silicon 12 melted in the body 211 is supplied to the main crucible 11 and in which the molten silicon moves. That is, the beak 212 is an extension portion protruding so that the molten silicon 12 is poured from the preliminary melting unit 200 into the main crucible 11.

As illustrated in FIG. 2, the preliminary crucible 210 includes a front support bar 213 and a rear support bar 214 that support one side and another side, respectively, and the rear support bar 214 may be formed to move upward in a state in which a height of the front support bar 213 is fixed such that the molten silicon 12 is supplied to the main crucible 11.

The preliminary crucible 210 may be disposed in a heating space 222 inside the preliminary crucible heating module 220, and the preliminary crucible heating module 220 may heat the preliminary crucible 210 in various methods. For example, the preliminary crucible heating module 220 may heat the preliminary crucible 210 using an induction heating method.

To this end, the preliminary crucible heating module 220 may include an induction coil 221 which is disposed to surround the heating space 222 and heats the preliminary crucible 210 using an induced current.

When current is supplied to the induction coil 221, a magnetic field is generated. The magnetic field generated in the induction coil 221 allows current to be generated in an MP susceptor 224 through electromagnetic induction, and the induced current generated in the susceptor 224 is converted into thermal energy.

In this case, a separate MP heating tube 225 that surrounds the preliminary crucible 210 may be additionally disposed inside the heating space 222, and the magnetic field generated in the induction coil 221 allows current to be generated in the heating tube 225 through electromagnetic induction, and the induced current generated in the heating tube 225 may be converted into thermal energy.

To this end, the susceptor 224 or the heating tube 225 may be made of a material which may generate an induced current. The preliminary crucible 210 may use a quartz material, and may be configured by welding fused quartz and plate-shaped quartz. Alternatively, it is also possible to weld and use quartz in the form of a plate and quartz in the form of a tube. In addition, the preliminary crucible 210 may include materials such as silicon nitride, alumina, zirconia, silica, and compounds thereof.

As described above, when the heating tube 225 is used, the heating tube 225 may include a graphite material. In this case, in order to prevent carbon contamination, a silicon carbide (SiC) coating may be added to a surface of the graphite, or a silicon carbide (SiC) material having resistance values allowing an induced current to be generated may be used.

Further, the heating tube 225 is not limited to being made of the graphite material, and may include various materials having strong heat resistance and conductor properties.

That is, as described above, the induction coil 221 may heat the susceptor 224 or the heating tube 225 using an induction heating method, and in particular, since the induction coil 221 is disposed to surround the heating space 222, heating efficiency can be maximized.

As illustrated in FIG. 2, the preliminary crucible heating module 220 may further include a shield 223 that surrounds an outer circumferential surface of the induction coil 221. The shield 223 may be formed to surround the outer circumferential surface of the induction coil 221, and may support the induction coil 221 to maintain a spiral shape. Further, the shield 223 may block the induction coil 221 to be exposed toward the heating space 222 as well as the outside.

Accordingly, the shield 223 blocks the induction coil 221 to be exposed toward the heating space 222, and thus, when a magnetic field is formed while current flows through the induction coil 221, it is possible to prevent an arc discharge from occurring due to a plasma phenomenon in a vacuum state or from occurring when the induction coil 221 comes into contact with an inert gas such as argon present in the heating space 222.

The shield 223 may be made of a highly heat-resistant ceramic material. For example, the ceramic material may include at least one of aluminum oxide (Al$_2$O$_3$), silicon dioxide (SiO$_2$), zirconium dioxide (ZrO$_2$), and silicon nitride (Si$_3$N$_4$).

In this way, when the solid silicon material is melted in the preliminary melting unit 200 and the molten silicon 12 is supplied to the main crucible 11, the configurations of the main crucible 11 can be simplified, the splashing of the molten silicon 12 accommodated in the main crucible 11 can be prevented, and as compared to supplying the solid silicon material directly to the main crucible 11, it is possible to supply a quantity in proportion to the weight of the growing ingot 30 in a fixed amount. Further, since the solid silicon material is melted in the preliminary melting unit 200 and is supplied, the durability of the main crucible 11 is not reduced even when a large size solid silicon material is used, and thus the main crucible 11 can be used for a long time. For example, a size of an available solid silicon material may range from about 10 to 30 mm, but a solid silicon material of 30 mm or more may also be used.

In addition, since the large size solid silicon material has a relatively low degree of contamination, the quality of the growing ingot 30 becomes excellent. Furthermore, since the preliminary melting unit 200 heats the preliminary crucible 210 using an induction heating method, the configurations of the entire apparatus can be simplified.

In this case, as illustrated in FIG. 2, an opening H may be formed in the body 211 so that the molten silicon 12 moves to the beak 212. As the solid silicon accommodated in the body 211 is melted, floating matter 12a is generated, and the floating matter 12a floats on top of the molten silicon 12 due to buoyancy.

The floating matter 12a may include not only foreign matter such as impurities but also un-melted solid silicon, and when the floating matter 12a moves to the main crucible 11, the floating matter 12a can act as particles that hinder the growth of the ingot 30, and thus it is necessary to block the floating matter 12a so as not to be moved to the main crucible 11.

Accordingly, as described above, when the opening H is formed in the body 211, the opening H blocks the floating matter 12a floating on top of the molten silicon 12 and only the molten silicon 12 moves, and thus the quality of the ingot 30 becomes excellent, and yield reduction caused by the particles can be prevented.

Further, since the opening H limits an area in which the molten silicon 12 can move, a supply amount of molten silicon 12 may be adjusted so that a large amount of molten silicon 12 can be prevented from being supplied at one time.

For example, the opening H may be formed to have a diameter of about 10 mm, but the present invention is not necessarily limited thereto, and the opening H may be formed in various sizes according to the amount of the molten silicon 12 to be supplied.

Figure 3:
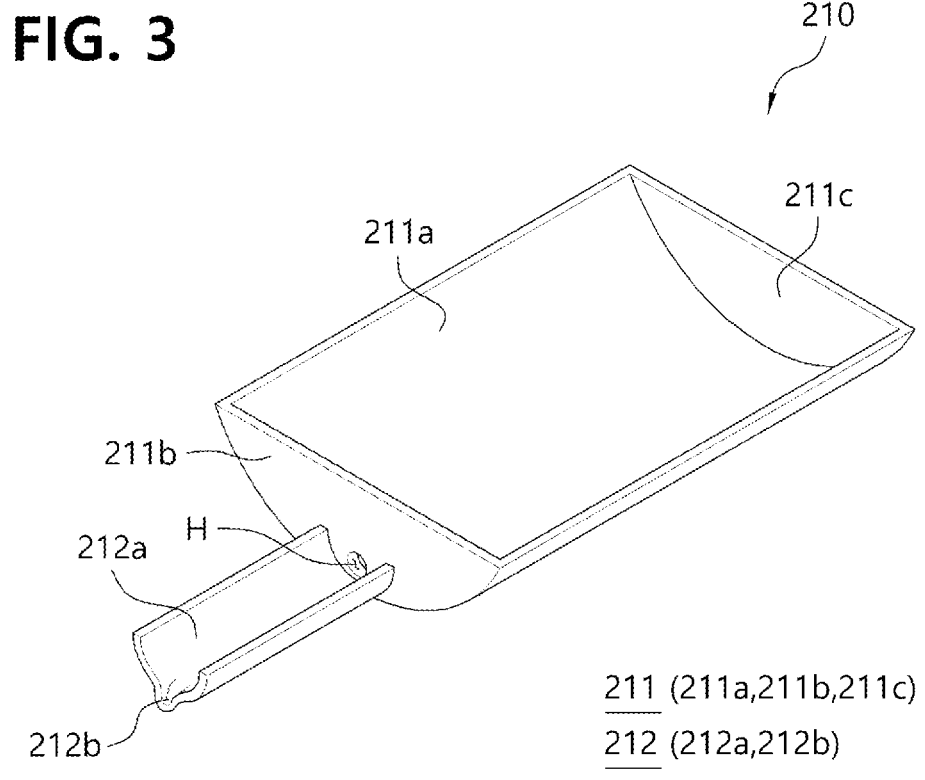
FIG. 3 is a perspective view illustrating a preliminary crucible according to an embodiment of the present invention.

FIG. 3 is a perspective view illustrating a preliminary crucible according to an embodiment of the present invention.

As illustrated in FIG. 3, a body 211 may include a body plate 211a in the form of a container opened upward in a height direction to accommodate a solid silicon material, a first partition 211b provided on one side of the body plate 211a and in which an opening H is formed, and a second partition 211c provided on another side of the body plate 211a.

That is, the solid silicon material is melted in a state of being accommodated in an inner space that is surrounded by the body plate 211a, the first partition 211b, and the second partition 211c, and an opening H is formed in the first partition 211b so that molten silicon 12 moves to a beak 212 through the opening H.

Figure 4:
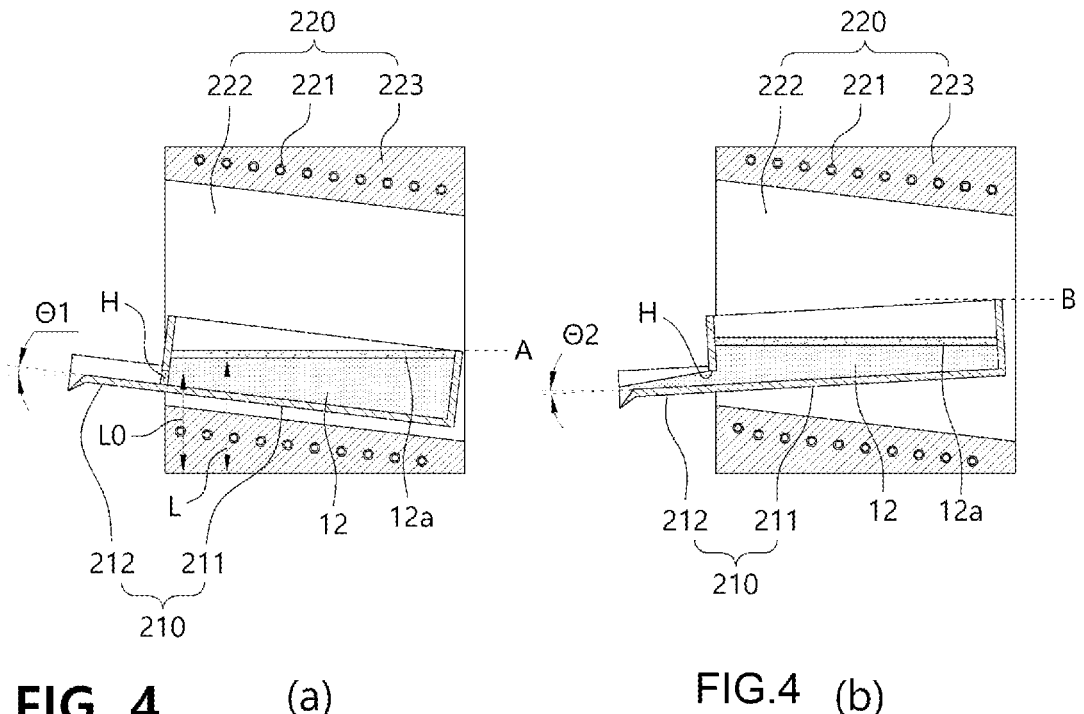

FIG. 4 is a set of cross-sectional views illustrating a preliminary melting unit according to an embodiment of the present invention, wherein FIG. 4(a) is a view illustrating a state in which the preliminary crucible is positioned at a first position, and FIG. 4(b) is a view illustrating a state in which the preliminary crucible is positioned at a second position.

As illustrated in FIG. 4, an opening H may be formed at a lowermost end of a first partition 211b in a height direction. That is, when the opening H is formed at the lowermost end of the first partition 211b, only molten silicon 12 may pass therethrough, and the movement of floating matter 12a floating on top of the molten silicon 12 is restricted by a portion (portion positioned at a level higher than a height of an uppermost end of the opening H) of the first partition 211b in which the opening H is not formed, and thus the floating matter 12a cannot move to a beak 212.

Further, a preliminary crucible 210 is movable between a first position A at which a solid silicon material is accommodated as illustrated in FIG. 4(a) and a second position B at which the molten silicon 12 is supplied to a main crucible 11 as illustrated in FIG. 4(b).

In this case, as illustrated in FIG. 4, at the first position A, a first slope θ1 may be formed on the preliminary crucible 210 in an upward direction. That is, since the first slope θ1 is formed on a lower surface of the preliminary crucible 210, the molten silicon 12 is stably accommodated and thus can be prevented from being arbitrarily supplied to the main crucible 11.

Further, at the second position B, a second slope θ2 may be formed on the preliminary crucible 210 in a downward direction. That is, since the molten silicon has substantially the same viscosity as water, the molten silicon may be supplied to the main crucible 11 through the beak 212 when the second slope θ2 is formed on a lower surface of the preliminary crucible 210.

For example, the first slope θ1 may be about 7° and the second slope θ2 may range from about 1° to 2°, but the present invention is not necessarily limited thereto, and the first slope θ1 and the second slope θ2 may be correspondingly changed according to the size of the preliminary crucible 210 or the supply amount of the molten silicon 12.

In this way, when the preliminary crucible 210 is formed to supply the molten silicon 12 while rotating within a certain angle range, a period of time during which the preliminary crucible 210 is disposed adjacent to the molten silicon 12 accommodated in the main crucible 11 is reduced, and thus thermal deformation does not occur so that the preliminary crucible 210 can be used for a long time.

Further, in this way, the supply amount of the molten silicon 12 may be adjusted by adjusting the period of time during which the preliminary crucible 210 moves to the second position B or adjusting the angle of the preliminary crucible 210 at the second position B, and thus the molten silicon 12 may be supplied in a fixed amount.

For example, the supply amount of the molten silicon 12 may be adjusted by adjusting the angle of the preliminary crucible 210 and the period of time during which the preliminary crucible 210 is maintained in an inclined state according to the weight of the ingot 30 being grown.

As described above, the preliminary crucible 210 includes a front support bar 213 and a rear support bar 214 that support one side and another side, respectively, and when the preliminary crucible 210 moves from the first position A illustrated in FIG. 4(*a*) to the second position B illustrated in FIG. 4(*b*), the rear support bar 214 may be formed to move upward in a state in which a height of the front support bar 213 is fixed.

That is, by forming the preliminary crucible 210 so that another side thereof rotates around one side, the molten silicon 12 may be supplied in a simple manner, and the rear support bar 214 may be connected to a separate lifting module (not illustrated) so that the rear support bar 214 may move upward.

In this case, when a height L of the molten silicon 12 is higher than or equal to a height L0 of the uppermost end of the opening H as illustrated in FIG. 4(*a*), the preliminary crucible 210 may move from the first position A to the second position B, as illustrated in FIG. 4(*b*).

This is because the solid silicon material is melted at the first position A and when the height L of the molten silicon 12 is at least higher than the height L0 of the uppermost end of the opening H, the floating matter 12*a* floating on top of the molten silicon 12 cannot move through the opening H.

Figure 5:
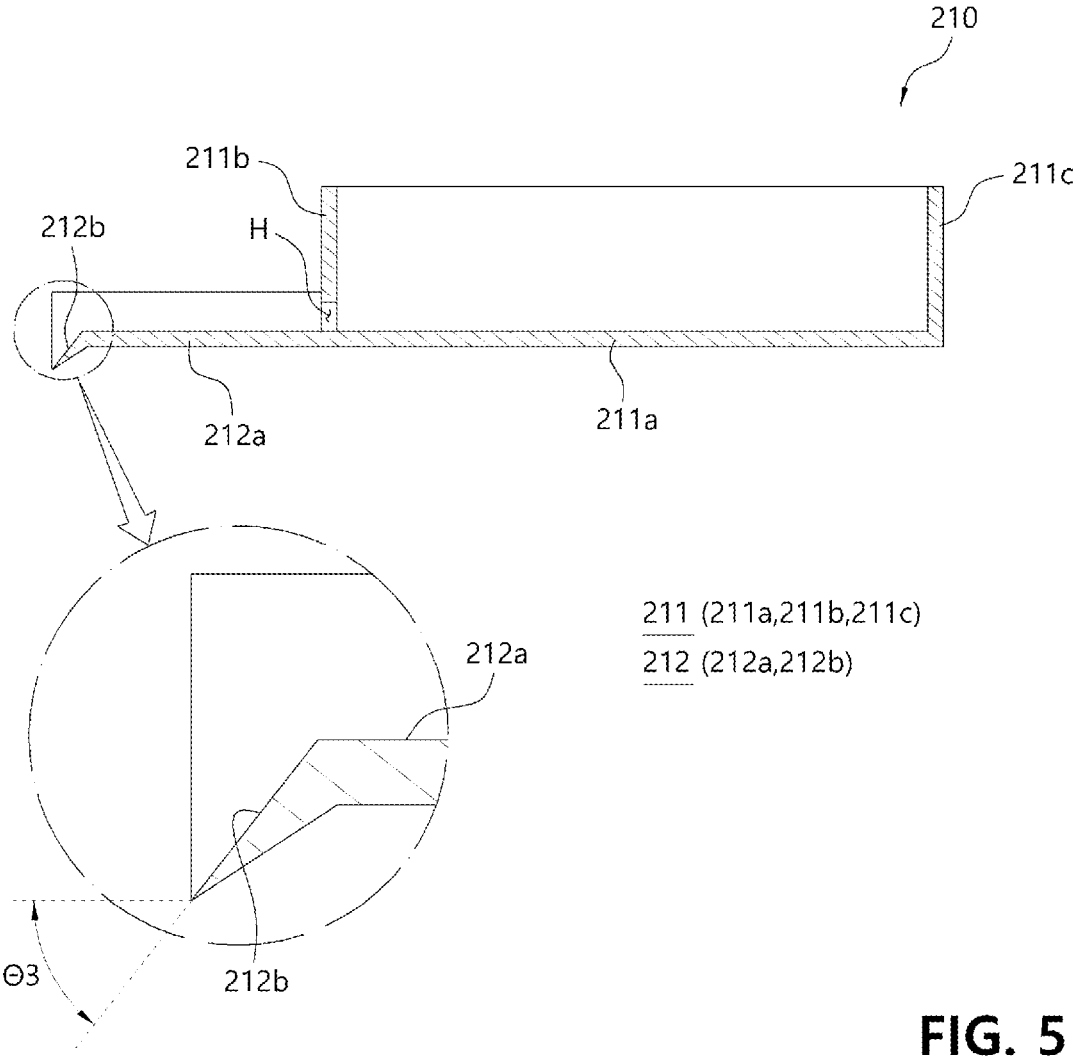
FIG. 5 is a cross-sectional view illustrating a preliminary crucible according to an embodiment of the present invention.

FIG. 5 is a cross-sectional view illustrating a preliminary crucible according to an embodiment of the present invention, and FIG. 6 is a front view illustrating the preliminary crucible according to the embodiment of the present invention.

As illustrated in FIG. 5, a beak 212 may include a moving surface 212*a* in the form of a container opened upward in a height direction to accommodate molten silicon 12 supplied to a main crucible 11, and an inclined surface 212*b* that is formed on one side of the moving surface 212*a* and formed with a downward slope θ3 in the height direction so as to be adjacent to the main crucible 11.

Since the moving surface 212*a* is formed in the form of the container opened upward in the height direction, the molten silicon 12 supplied to the main crucible 11 may not flow in another direction and may move stably toward the main crucible 11.

Further, since the molten silicon 12 that has moved to one side of the moving surface 212*a* is supplied to the main crucible 11 in a state of moving downward along the inclined surface 212*b*, a difference in height may be reduced, and thus the molten silicon 12 may be supplied slowly. As illustrated in FIG. 6, since the molten silicon 12 is collected and supplied through the moving surface 212*a*, a phenomenon of riding on and flowing down along the beak 212 is prevented, and through this, the influence of a difference between temperatures of the main crucible 11 and the preliminary crucible 210 can be relieved.

FIG. 7 is a front view illustrating a preliminary crucible according to another embodiment of the present invention, and FIG. 8 is a front view illustrating the preliminary crucible according to still another embodiment of the present invention.

As illustrated in FIG. 7, a moving surface 212*a* may be formed such that an interval between inner surfaces thereof disposed to face each other is constantly reduced.

That is, a shape in which an interval between inner surfaces of a beak 212 is reduced may be divided into three types, and as compared to in a round shape in which the interval between the inner surfaces of the beak 212 is smoothly reduced, a cross-sectional area in which molten silicon 12 moves is reduced in a shape (e.g., V-shaped cross section) in which the interval between the inner surfaces of the beak 212 is constantly reduced or in a shape (e.g., form in which the inner surfaces extending downward with respect to the V-shaped cross section is further depressed inward) in which the interval between the inner surfaces of the beak 212 is rapidly reduced and thus it becomes advantageous to control so that a small amount of molten silicon 12 is supplied in a fixed amount.

In this case, as illustrated in FIG. 7, a body plate 211*a* may also be formed such that an interval between inner surfaces thereof disposed to face each other is constantly reduced.

That is, as described above, the beak 212 may be formed in the form in which the interval between the inner surfaces is constantly or rapidly reduced, and the body plate 211*a* may be formed such that the interval between the inner surfaces disposed to face each other is constantly reduced.

In the case of the shape (e.g., V-shaped cross section) in which the interval between the inner surfaces of the body plate 211*a* disposed to face each other is constantly reduced, the body plate 211*a* may be easily manufactured using a raw material in the form of a thick plate, and a first partition 211*b* and a second partition 211*c* may be easily installed through welding or the like.

Alternatively, as illustrated in FIG. 8, the beak 212 may be formed in the form in which the interval between the inner surfaces is constantly reduced, and the body plate 211*a* may be formed in a round shape in which the interval between the inner surfaces is smoothly reduced.

Figure 9:
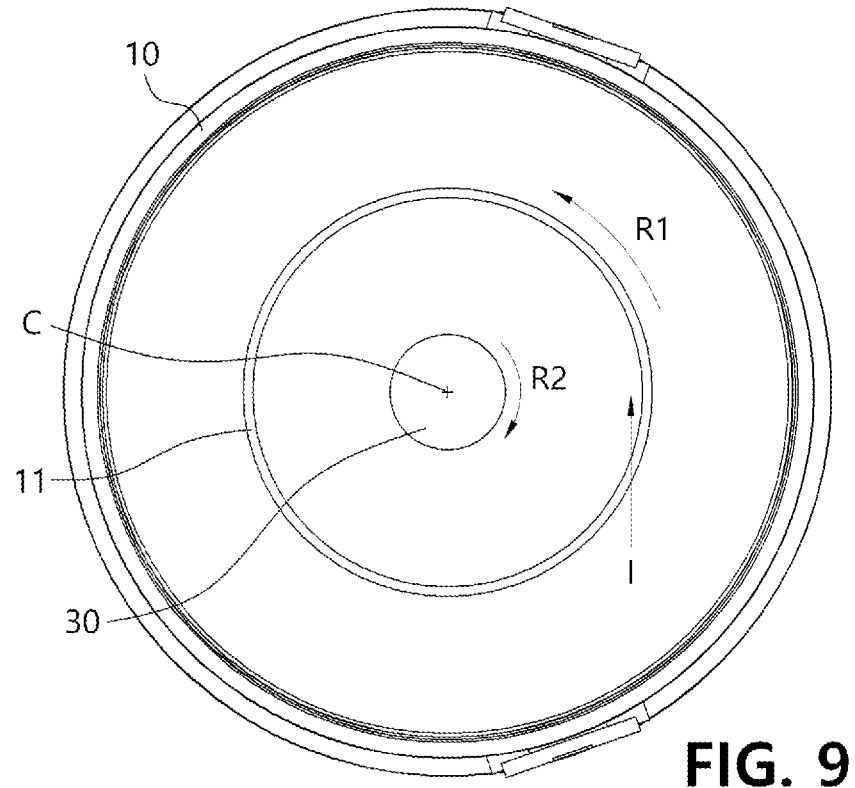
FIG. 9 is a cross-sectional view illustrating rotational directions of a main crucible and an ingot in a growth furnace according to an embodiment of the present invention.
Figure 10:
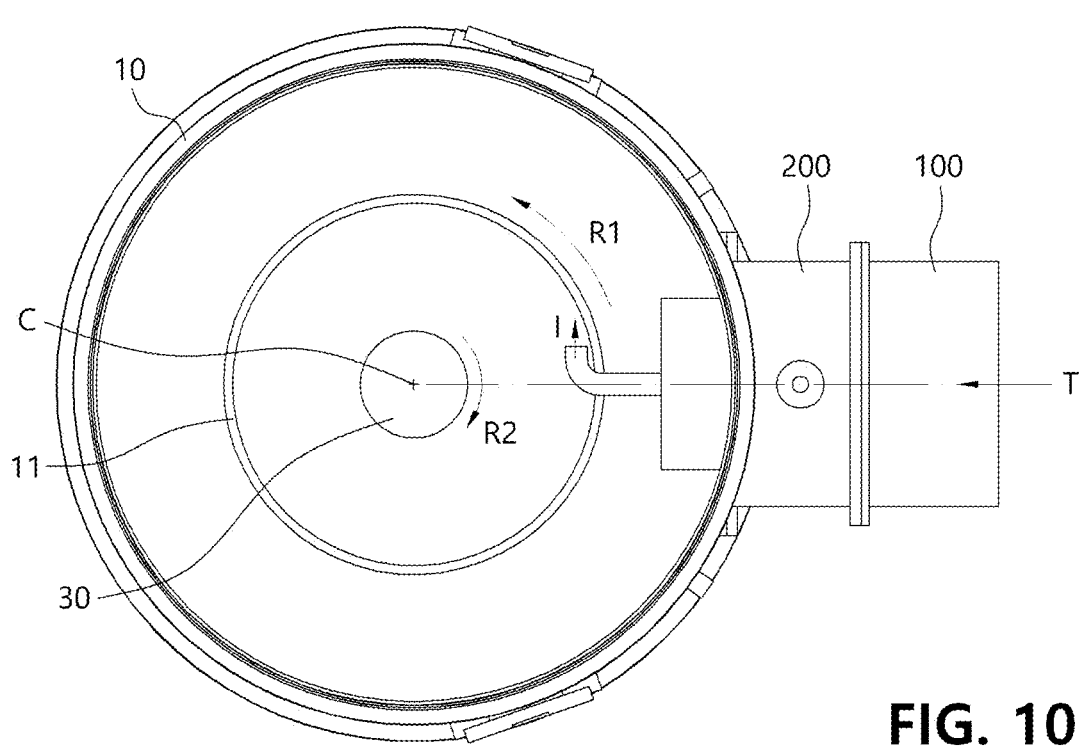
FIG. 10 is a cross-sectional view illustrating a direction in which molten silicon is supplied in a state in which a preliminary melting unit is provided in a growth furnace according to an embodiment of the present invention.
Figure 11:
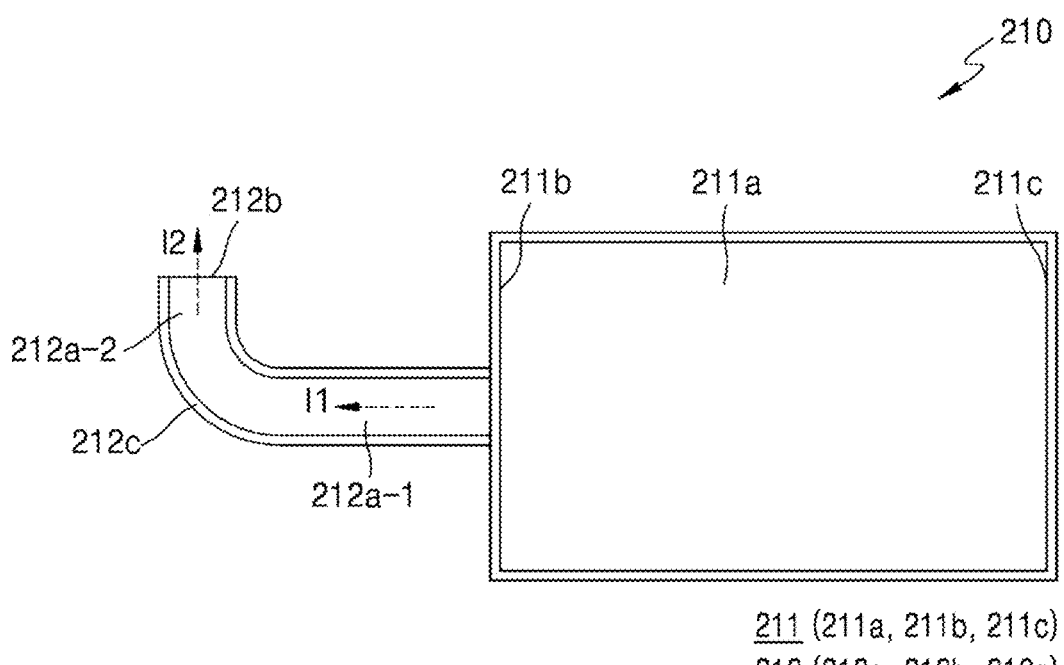
FIG. 11 is a plan view illustrating a preliminary crucible according to yet another embodiment of the present invention.

FIG. 9 is a cross-sectional view illustrating rotational directions of a main crucible and an ingot in a growth furnace according to an embodiment of the present invention, FIG. 10 is a cross-sectional view illustrating a direction in which molten silicon is supplied in a state in which a preliminary melting unit is provided in a growth furnace according to the embodiment of the present invention, and FIG. 11 is a plan view illustrating the preliminary crucible according to yet another embodiment of the present invention.

As illustrated in FIG. 9, since a main crucible 11 rotates in one direction R1, molten silicon 12 accommodated in the main crucible 11 also rotates in the direction R1. In this case, a rotational speed of the main crucible 11 may range from about 5 to 10 rpm. On the other hand, since a lifting wire 40 is lifted upward while rotating in another direction R2, a growing ingot 30 also rotates in the direction R2.

In this case, a direction I in which the molten silicon 12 is supplied may be formed in a tangential direction of the molten silicon 12 that rotates in the direction R1 together with the main crucible 11, and with this configuration, a temperature distribution of the molten silicon 12 accommodated in the main crucible 11 can be stably maintained.

To this end, as illustrated in FIG. 10, a beak 212 may be disposed so that the molten silicon 12 in the main crucible 11 is supplied in a direction tangential to the rotational direction of the molten silicon 12.

In this way, the molten silicon 12 supplied through the beak 212 may be supplied to an outermost side in a radial direction of the molten silicon 12 accommodated in the main crucible 11, and to this end, the supplied molten silicon 12 may be supplied while flowing down along an inner wall of the main crucible 11.

When the main crucible 11 rotates in one direction R1, a flow that moves outward in a radial direction is formed in the molten silicon 12 accommodated in the main crucible 11 due to a centrifugal force, and when the molten silicon 12 is supplied to the outermost side in the radial direction in a state in which such a flow is formed in the molten silicon 12 accommodated in the main crucible 11, the supplied molten silicon 12 cannot move rapidly inward in the radial direction of the main crucible 11 due to the flow formed in the main crucible.

For example, in order for the solid silicon to be melted, it is necessary to heat at least a temperature of 1,420° C. or higher, which is a melting temperature of silicon. Therefore, in order for the molten silicon 12 to be smoothly supplied, a temperature of the molten silicon 12 supplied through the preliminary crucible 210 also needs to be a temperature of 1,420° C. or higher, but a central portion of the main crucible 11 is a portion in which an ingot 30 grows, and has a temperature lower than 1,420° C.

That is, since the temperature distribution of the molten silicon 12 supplied in a process in which the supplied molten silicon 12 moves gradually inward in the radial direction of the main crucible 11 and the temperature distribution of the molten silicon 12 positioned in the central portion of the main crucible may be formed similarly, the quality and yield of the growing ingot 30 become excellent.

As illustrated in FIG. 10, when a material supply unit 100 and a preliminary melting unit 200 are disposed on one side of a growth furnace 10, the material supply unit 100 and the preliminary melting unit 200 may be disposed so that a direction T in which solid silicon is introduced through the material supply unit 100 and a direction in which the molten silicon 12 melted through the preliminary melting unit 200 is supplied to the main crucible 11 are directed toward a center C of the growth furnace 10, and when the material supply unit 100 and the preliminary melting unit 200 are disposed in this way, the growth furnace 10 can be structurally stabilized, and a path through which not only the solid silicon but also the molten silicon 12 travel is formed as a shortest distance so that the molten silicon 12 can be smoothly supplied.

However, as described above, when the molten silicon 12 is supplied to the main crucible 11 rotating in one direction R1, it is preferable for the molten silicon 12 to be supplied in the tangential direction of the molten silicon 12 accommodated in the main crucible 11 and being rotate together in that the temperature distribution of the molten silicon 12 accommodated in the main crucible 11 can be stably maintained. However, when the material supply unit 100 and the preliminary melting unit 200 are disposed in the direction toward the center C of the growth furnace 10, there is a problem in that it becomes difficult to supply the molten silicon 12 in the tangential direction of the molten silicon 12 accommodated in the main crucible 11 and being rotate together.

In order to solve the above problem, as illustrated in FIG. 11, a beak 212 may have a curved surface 212c on which a moving direction of molten silicon 12 is changed so that the molten silicon 12 moves first along a first moving surface 212a-1 extending in a first supply direction 11 toward a center C of the main crucible 11, and then moves along a second moving surface 212a-2 extending in a second supply direction 12, which is a direction tangential to a rotational direction of the main crucible 11.

That is, since a material supply unit 100 and a preliminary melting unit 200 are disposed in the direction toward the center C of the growth furnace 10, a path through which the molten silicon 12 moves may be formed as a shortest distance and a moving direction of the molten silicon 12 moving along the beak 212 may be changed, the supplied molten silicon 12 may be supplied in the direction tangential to the rotational direction of the molten silicon 12 rotating in the main crucible 11, and thus a temperature distribution of the molten silicon 12 accommodated in the main crucible 11 can be stably maintained.

Figure 12:
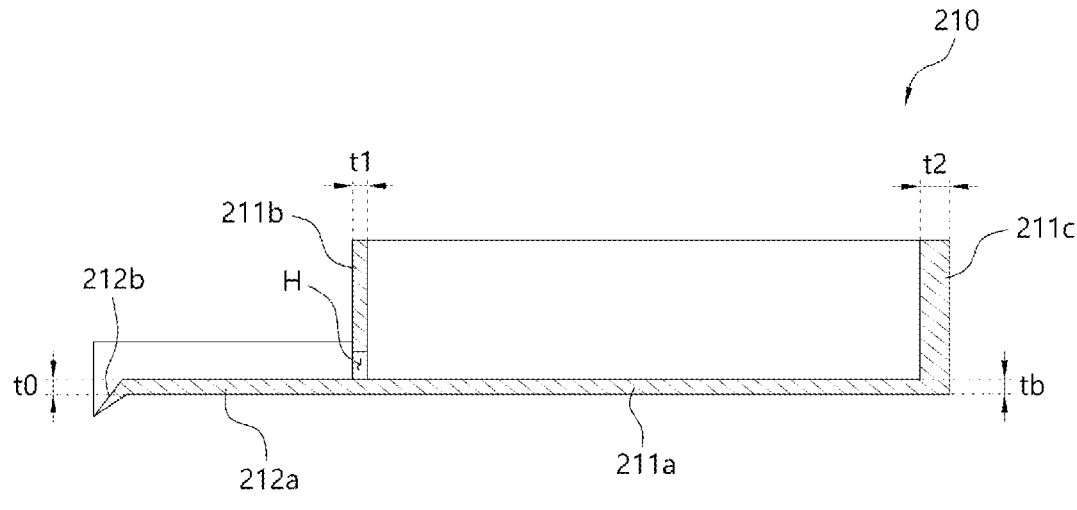
FIG. 12 is a cross-sectional view illustrating a preliminary crucible according to yet another embodiment of the present invention, and is a view illustrating a state in which a second partition is formed to be thicker than a beak.
Figure 13:
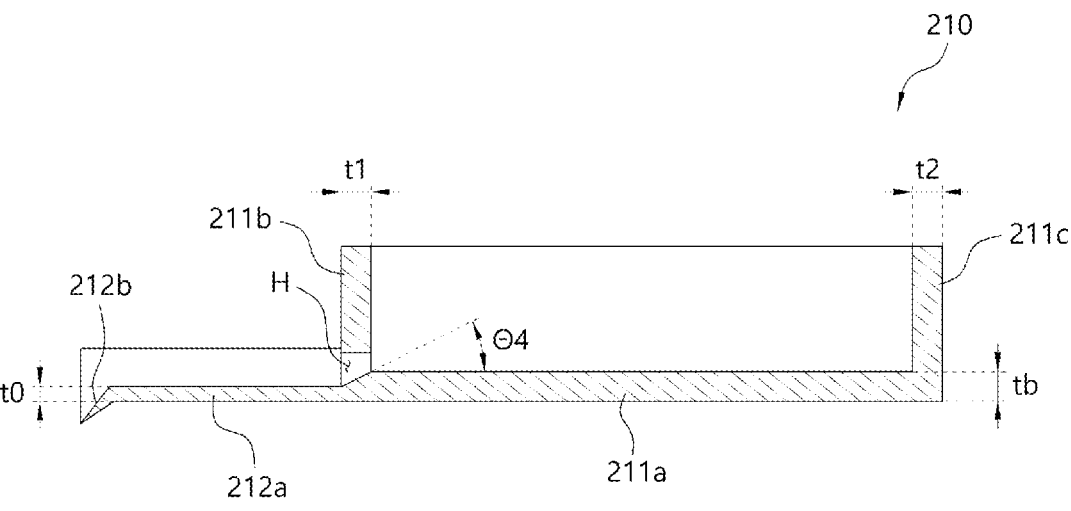
FIG. 13 is a cross-sectional view illustrating a preliminary crucible according to yet another embodiment of the present invention, and is a view illustrating a state in which a body plate and first and second partitions are formed to be thicker than a beak.
Figure 14:
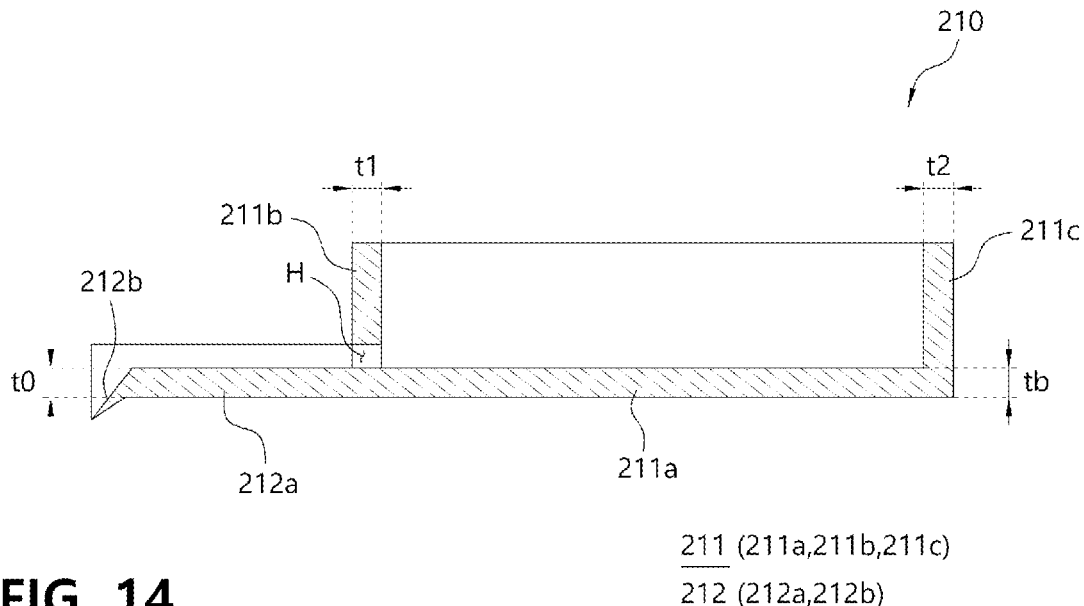
FIG. 14 is a cross-sectional view illustrating a preliminary crucible according to yet another embodiment of the present invention, and is a view illustrating a state in which both a body and a beak are thickly formed.

FIG. 12 is a cross-sectional view illustrating a preliminary crucible according to yet another embodiment of the present invention, and is a view illustrating a state in which a second partition is formed to be thicker than a beak, FIG. 13 is a cross-sectional view illustrating a preliminary crucible according to yet another embodiment of the present invention, and is a view illustrating a state in which a body plate and first and second partitions are formed to be thicker than a beak, and FIG. 14 is a cross-sectional view illustrating a preliminary crucible according to yet another embodiment of the present invention, and is a view illustrating a state in which both a body and a beak are thickly formed.

As illustrated in FIG. 12, a thickness t2 of a second partition 211c may be greater than a thickness t0 of a beak 212. That is, in the case in which an inside of a preliminary melting unit 200 is heated, when the heat is concentrated on the second partition 211c, the second partition 211c may be deformed due to the concentration of the heat, but as described above, when the second partition 211c is formed thickly, such deformation can be prevented from occurring.

For example, when the thickness t0 of the beak 212 is about 5 mm, the thickness t2 of the second partition 211c may be about 10 mm.

Alternatively, as illustrated in FIG. 13, a thickness tb of a body plate 211a and a thickness t1 of a first partition 211b may be greater than the thickness t0 of the beak 212, and a slope θ4 may be formed in an opening H so that the molten silicon 12 moves downward from the body plate 211a to the beak 212.

In this way, when the body plate 211a is formed to be thicker than the beak 212, the downward slope θ4 may be formed due to a difference in thickness and the molten silicon 12 may move smoothly due to the slope θ4, and when the first partition 211b is formed sufficiently thick, not only may thermal deformation be prevented, but also a length of the downward slope θ4 is sufficiently long, and the downwardly moving molten silicon 12 can be stably guided.

As described above, for example, the thickness tb of the body plate 211a and the thickness t1 of the first partition 211b may also be about 10 mm.

In this case, since an etching reaction occurs inside the body 211 when melting the solid silicon, a thickness of the body 211 may be gradually reduced as the body 211 is used for a long time, and thus the body 211 may be formed to have a sufficient thickness.

Meanwhile, as illustrated in FIG. 14, the thickness t0 of the beak 212 is as thick as the thicknesses of the body plate 211a, the first partition 211b, and the second partition 211c provided in the body 211, and with this configuration, it is possible to prevent thermal deformation of the beak 212 even when used for a long time.

As described above, in the continuous ingot growing apparatus according to an embodiment of the present invention, since the solid silicon material is melted in the preliminary crucible 210 and the molten silicon 12 is supplied to the main crucible 11, the configurations of the main crucible 11 can be simplified, and the splashing of the molten silicon 12 can be prevented, and in particular, the opening H through which the molten silicon 12 moves may be formed in the body 211 of the preliminary crucible 210 to block the floating matter 12a floating on top of the molten silicon 12 so as not to be supplied, and at the same time, the supply amount of the molten silicon 12 can be adjusted.

In the continuous ingot growing apparatus according to another embodiment of the present invention, the growth furnace 10 in which the main crucible 11 is positioned in which the molten silicon 12 is accommodated to form the ingot 30, and the material supply unit 100 that supplies the solid silicon material before the molten silicon 12 is melted may be provided, and the material supply unit 100 measures the amount of the solid silicon material and supplies the solid silicon material in a fixed amount to the preliminary melting unit 200.

The preliminary melting unit 200 described above may include a preliminary crucible 210 that melts the solid silicon material supplied from the material supply unit 100 and supplies the molten silicon 12 to the main crucible 11, and a preliminary crucible heating module 220 that heats the preliminary crucible 210.

The preliminary crucible 210 includes a body 211 in which the solid silicon material is accommodated, and a beak 212 provided on one side of the body 211 so that the molten silicon 12 melted in the body 211 is supplied to the main crucible 11 and in which the molten silicon moves. The body 211 includes the body plate 211a in the form of a container opened upward in the height direction to accommodate the solid silicon material, and the body plate 211a may be formed in the form in which the interval between the inner surfaces disposed to face each other is gradually reduced.

In this case, as illustrated in FIG. 6, the body plate 211a may be formed such that the interval between the inner surfaces disposed to face each other is smoothly reduced, and for example, the body plate 211a may be formed in the round shape.

Alternatively, as illustrated in FIG. 7, the body plate 211a may be formed such that the interval between the inner surfaces disposed to face each other is constantly reduced.

That is, as described above, the beak 212 may be formed in the form in which the interval between the inner surfaces is constantly or rapidly reduced, and the body plate 211a may be formed such that the interval between the inner surfaces disposed to face each other is constantly reduced.

In the case of the shape (e.g., V-shaped cross section) in which the interval between the inner surfaces of the body plate 211a disposed to face each other is constantly reduced, the body plate 211a may be easily manufactured using a raw material in the form of a thick plate, and a first partition 211b and a second partition 211c may be easily installed through welding or the like.

The opening H may be formed in the body 211 so that the molten silicon 12 moves to the beak 212, and when the opening H is formed in the body 211 in this way, the opening H blocks the floating matter 12a floating on top of the molten silicon 12 and only the molten silicon 12 moves, and thus the quality of the ingot 30 becomes excellent, and yield reduction caused by the particles can be prevented.

Further, the body 211 may include the first partition 211b provided on one side of the body plate 211a and in which the opening H is formed, and the second partition 211c provided on another side of the body plate 211a.

The beak 212 may include the moving surface 212a in the form of a container opened upward in a height direction so that the molten silicon 12 supplied to the main crucible 11 is accommodated, and since the moving surface 212a is formed in the form of a container opened upward in the height direction, the molten silicon 12 supplied to the main crucible 11 may not flow in another direction and may move stably toward the main crucible 11.

Further, since the molten silicon 12 that has moved to one side of the moving surface 212a is supplied to the main crucible 11 in a state of moving downward along the inclined surface 212b, a difference in height is reduced, and thus the molten silicon 12 may be supplied slowly. As illustrated in FIG. 6, since the molten silicon 12 is collected and supplied through the moving surface 212a, a phenomenon of riding on and flowing down along the beak 212 is prevented, and through this, the influence of a difference between the temperatures of the main crucible 11 and the preliminary crucible 210 can be relieved.

The moving surface 212a may be formed such that the interval between the inner surfaces disposed to face each other is gradually reduced.

In this case, the moving surface 212a may be formed such that the interval between the inner surfaces disposed to face each other is constantly reduced. That is, the shape in which an interval between inner surfaces of a beak 212 is reduced may be divided into three types, and as compared to in a round shape in which the interval between the inner surfaces of the beak 212 is smoothly reduced, a cross-sectional area in which molten silicon 12 moves is reduced in a shape (e.g., V-shaped cross section) in which the interval between the inner surfaces of the beak 212 is constantly reduced or in a shape (e.g., form in which the inner surfaces extending downward with respect to the V-shaped cross section is further depressed inward) in which the interval between the inner surfaces of the beak 212 is rapidly reduced and thus it becomes advantageous to control so that a small amount of molten silicon 12 is supplied in a fixed amount.

In this way, in the continuous ingot growing apparatus according to another embodiment of the present invention, since the solid silicon material is melted in the preliminary crucible 210 and the molten silicon 12 is supplied to the main crucible 11, the configurations of the main crucible 11 can be simplified, and the splashing of the molten silicon 12 can be prevented, and in particular, the opening H through which the molten silicon 12 moves may be formed in the body 211 of the preliminary crucible 210 to block the floating matter 12a floating on top of the molten silicon 12 so as not to be supplied, and at the same time, the supply amount of the molten silicon 12 can be adjusted.

According to the above configuration, in the continuous ingot growing apparatus according to an aspect of the present invention, since a solid silicon material is melted in a preliminary crucible and molten silicon is supplied to a main crucible, the configurations of the main crucible can be simplified, and the splashing of the molten silicon can be prevented, and in particular, an opening through which the molten silicon moves can be formed in a body of a preliminary crucible to block floating matter floating on top of the molten silicon so as not to be supplied, and at the same time, a supply amount of the molten silicon can be adjusted.

Further, in the continuous ingot growing apparatus according to an aspect of the present invention, by forming an inclined surface on one side of a beak, in which molten silicon moves, and forming with a downward slope in a height direction so as to be adjacent to the main crucible, a difference in height can be reduced, and thus the molten silicon can be supplied slowly without splashing.

Further, in the continuous ingot growing apparatus according to an aspect of the present invention, a beak can be formed such that an interval between inner surfaces of the beak in which molten silicon moves is constantly reduced, and thus it becomes easy to control so that a small amount of molten silicon is supplied in a fixed amount.

In addition, in the continuous ingot growing apparatus according to an aspect of the present invention, since supplied molten silicon is supplied in a direction tangential to a rotational direction of the molten silicon rotating in a main crucible, a temperature distribution of the molten silicon accommodated in the main crucible can be stably maintained.

While the present invention has been described with reference to exemplary embodiments thereof, the spirit of the present invention is not limited to the embodiments presented in this specification. Those skilled in the art who understand the spirit of the present invention may easily suggest other embodiments by adding, changing, or deleting elements within the scope of the same concept, and the other embodiments are also within the spirit of the present invention.

What is claimed is:

1. A continuous ingot growing apparatus comprising:
a growth furnace in which a main crucible is positioned in which molten silicon is accommodated to form an ingot;
a material supply unit configured to supply a solid silicon material for melting into the molten silicon; and
a preliminary melting unit including a preliminary crucible that melts the solid silicon material supplied from the material supply unit and supplies the molten silicon to the main crucible, and a preliminary crucible heating module that heats the preliminary crucible,
wherein the preliminary crucible includes a body in which the solid silicon material is accommodated, and a beak which is provided on one side of the body so that the molten silicon melted in the body is supplied to the main crucible, and in which the molten silicon moves, and
an opening is formed in the body so that the molten silicon moves to the beak,
wherein the body includes a body plate in a form of a container opened upward in a height direction to accommodate the solid silicon material, a first partition provided on one side of the body plate and in which the opening is formed, and a second partition provided on another side of the body plate,
wherein the preliminary crucible is movable between a first position at which the solid silicon material is accommodated and a second position at which the molten silicon is supplied to the main crucible, wherein, in the first position, the preliminary crucible is inclined upward from the second partition to the first partition at a first inclination angle; and
the preliminary crucible moves from the first position to the second position when a height of the molten silicon is higher than or equal to a height of an uppermost end of the opening,
wherein the beak includes a moving surface opened upward in the height direction to accommodate the molten silicon supplied to the main crucible,
wherein the moving surface includes a first moving surface extending in a first supply direction toward a center of the main crucible and a second moving surface extending in a second supply direction tangential to a rotational direction of the main crucible, and
wherein the beak includes a curved surface connecting the first moving surface and the second moving surface to change a moving path of the molten silicon from the first supply direction to the second supply direction, and
wherein the center of the main crucible is positioned on a longitudinal central axis of the first moving surface.

2. The continuous ingot growing apparatus of claim 1, wherein the opening is formed at a lowermost end of the first partition in the height direction.

3. The continuous ingot growing apparatus of claim 1, wherein the beak further includes an inclined surface that is formed on one side of the moving surface and formed with a downward slope in the height direction so as to be adjacent to the main crucible.

4. The continuous ingot growing apparatus of claim 1, wherein the moving surface is formed such that an interval between inner surfaces thereof disposed to face each other is constantly reduced.

5. The continuous ingot growing apparatus of claim 4, wherein the body plate is formed such that an interval between inner surfaces thereof disposed to face each other is constantly reduced.

6. The continuous ingot growing apparatus of claim 1, wherein:
the molten silicon accommodated in the main crucible rotates in one direction; and
the beak is disposed such that the molten silicon melted in the body is supplied to the main crucible in the second supply direction.

7. The continuous ingot growing apparatus of claim 1, wherein a thickness of the second partition is greater than a thickness of the beak.

8. The continuous ingot growing apparatus of claim 7, wherein:
a thickness of the body plate and a thickness of the first partition are greater than the thickness of the beak; and
a slope is formed in the opening so that the molten silicon moves downward from the body plate to the beak.

* * * * *